(12) United States Patent
Kuraguchi

(10) Patent No.: US 9,543,286 B2
(45) Date of Patent: Jan. 10, 2017

(54) SEMICONDUCTOR DEVICE

(75) Inventor: Masahiko Kuraguchi, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 464 days.

(21) Appl. No.: 12/728,901

(22) Filed: Mar. 22, 2010

(65) Prior Publication Data

US 2010/0244050 A1 Sep. 30, 2010

(30) Foreign Application Priority Data

Mar. 25, 2009 (JP) .................................. 2009-073232

(51) Int. Cl.
| | |
|---|---|
| *H01L 27/105* | (2006.01) |
| *H01L 27/02* | (2006.01) |
| *H01L 27/06* | (2006.01) |
| *H01L 29/417* | (2006.01) |
| *H01L 29/778* | (2006.01) |
| *H01L 29/872* | (2006.01) |
| *H01L 21/82* | (2006.01) |
| *H01L 29/16* | (2006.01) |

(Continued)

(52) U.S. Cl.
CPC ....... *H01L 27/0211* (2013.01); *H01L 27/0207* (2013.01); *H01L 27/0629* (2013.01); *H01L 29/41758* (2013.01); *H01L 29/7787* (2013.01); *H01L 29/872* (2013.01); *H01L 21/8213* (2013.01); *H01L 29/1608* (2013.01); *H01L 29/2003* (2013.01); *H01L 29/4238* (2013.01)

(58) Field of Classification Search
CPC .............. H01L 27/0207; H01L 27/0211; H01L 29/41758
See application file for complete search history.

(56) References Cited

U.S. PATENT DOCUMENTS

| | | | | |
|---|---|---|---|---|
| 4,965,863 | A | * | 10/1990 | Cray .............................. 326/116 |
| 2002/0070412 | A1 | * | 6/2002 | Mitlehner et al. ............ 257/401 |

(Continued)

FOREIGN PATENT DOCUMENTS

| | | |
|---|---|---|
| JP | 2003-133557 | 5/2003 |
| JP | 2007-027440 | 2/2007 |

(Continued)

OTHER PUBLICATIONS

Japanese Office Action for Application No. 2009-073232 dated Aug. 23, 2011.

*Primary Examiner* — Fei Fei Yeung Lopez

(74) *Attorney, Agent, or Firm* — Amin, Turocy & Watson LLP

(57) ABSTRACT

A semiconductor device which is capable of operating at an operation frequency "f", includes a substrate, a first element unit and a second element unit. The substrate has a thermal diffusion coefficient "D". The first element unit is formed on the substrate. The first element includes a first active element. The second element unit is adjacent to the first element unit on the substrate. The second element includes a second active element. The second active element acts on a different timing from the first active element. Moreover, a distance of between a first gravity center of the first element unit and a second gravity center of the second element unit is equal to or less than twice of a thermal diffusion length $(D/\pi f)^{1/2}$.

10 Claims, 15 Drawing Sheets

(51) Int. Cl.
*H01L 29/20* (2006.01)
*H01L 29/423* (2006.01)

(56) References Cited

U.S. PATENT DOCUMENTS

| | | | |
|---|---|---|---|
| 2003/0090235 A1* | 5/2003 | Tsuji | 320/128 |
| 2004/0130941 A1* | 7/2004 | Kan et al. | 365/177 |
| 2005/0121688 A1* | 6/2005 | Nagai et al. | 257/99 |
| 2007/0145390 A1 | 6/2007 | Kuraguchi | |
| 2008/0192395 A1* | 8/2008 | Albers et al. | 361/56 |
| 2008/0230807 A1* | 9/2008 | Kuroda et al. | 257/197 |
| 2009/0032821 A1* | 2/2009 | Onose et al. | 257/77 |
| 2009/0032879 A1* | 2/2009 | Kuraguchi | 257/368 |

FOREIGN PATENT DOCUMENTS

| | | |
|---|---|---|
| JP | 2007-173582 | 7/2007 |
| JP | 2008-182122 | 8/2008 |
| WO | 2005096365 A1 | 10/2005 |

* cited by examiner

SEMICONDUCTOR DEVICE

CROSS REFERENCE TO RELATED APPLICATIONS

This application is based upon and claims the benefit of priority from the Japanese Patent Application No. 2009-073232, filed on Mar. 25, 2009, the entire contents of which are incorporated herein by reference.

FIELD

The disclosure relates generally to a semiconductor device.

BACKGROUND

A semiconductor device for power conversion such as a switching element is formed by connecting active elements in parallel. The active element may be a transistor or a diode. Since each active element heats, temperature of the active element increases. Increasing the temperature causes degradation of performance and destruction of the active element. Therefore, it is important for the active element to inhibit increasing the temperature.

Some techniques to inhibit the temperature are disclosed in JP-A2008-182122(KOKAI) and JP-A2007-27440 (KOKAI). These references try to uniform the temperature in a chip by providing a space having no active element on the chip.

On the other hand, the semiconductor device for power conversion is better to have high breakdown voltage and low on resistance. It may be effective to use material having high critical electric field strength in order to achieve the high breakdown voltage. A wide-gap semiconductor may be preferable as the material having high critical electric field strength. Some techniques to use the wide-gap semiconductor for the semiconductor device of the power conversion are disclosed in JP-A2003-229566 (KOKAI) and JP-A2007-180454(KOKAI). In these references, the transistor and the diode are formed by nitride semiconductors which are one of the wide-gap semiconductors. The transistor and the diode are formed on a substrate as power converting elements.

It is important for the semiconductor device of power conversion to inhibit a maximum temperature in order to reduce degradation of performance and keep reliability. However, the conventional technique that heat is dispersed spatially may not enough to inhibit increasing the temperature of the active elements. Moreover, the conventional technique that the space having no active element exists in the chip causes increasing of chip area and cost.

BRIEF DESCRIPTION OF THE DRAWINGS

Aspects of this disclosure will become apparent upon reading the following detailed description and upon reference to the accompanying drawings. The description and the associated drawings are provided to illustrate embodiments of the invention and not limited to the scope of the invention.

DETAILED DESCRIPTION

According to one aspect of the invention, a semiconductor device which is capable of operating at an operation frequency "f", includes a substrate having a thermal diffusion coefficient "D";

a first element unit formed on the substrate, the first element including a first active element; and a second element unit being adjacent to the first element unit on the substrate, the second element including a second active element, the second active element acting on a different timing from the first active element, wherein a distance of between a first gravity center of the first element unit and a second gravity center of the second element unit is equal to or less than twice of a thermal diffusion length $(D/\pi f)^{1/2}$.

According to another aspect of the invention, a semiconductor device which is capable of operating at an operation frequency "f", includes a substrate having a thermal diffusion coefficient "D";

a first element unit formed on the substrate, the first element including a first active element; and a second element unit being adjacent to the first element unit on the substrate, the second element including a second active element, the second active element acting on a different timing from the first active element, wherein the first element unit and the second element unit are repeatedly arranged with a cycle, a half of the cycle is equal to or less than twice of a thermal diffusion length $(D/\pi f)^{1/2}$.

The embodiments will be explained with reference to the accompanying drawings.

In the embodiments, "gravity center" means geometric center of a two-dimensional figure. The geometric center is a position around which a first moment expressing spin of the two-dimensional figure is "0". Moreover, the gravity center is a position of the active element which may be heated.

In the embodiments, "element unit" means an element or aggregation of plural elements which each element has a same function.

In the embodiments, "two elements act on different timings" means that one of the two elements is activated during the other element is inactivated alternately. Therefore, the two elements do not start and finish operating at the same time.

In the embodiments, "wide-gap semiconductor" means a semiconductor having a wider band gap than Silicon (Si).

In the embodiments, "D" is a thermal diffusion coefficient expressed by dividing thermal conductivity (k) by density and specific heat capacity.

In the embodiments, "element temperature" means a temperature of a channel and a junction in the semiconductor device.

Description of the First Embodiment

Figure 1:
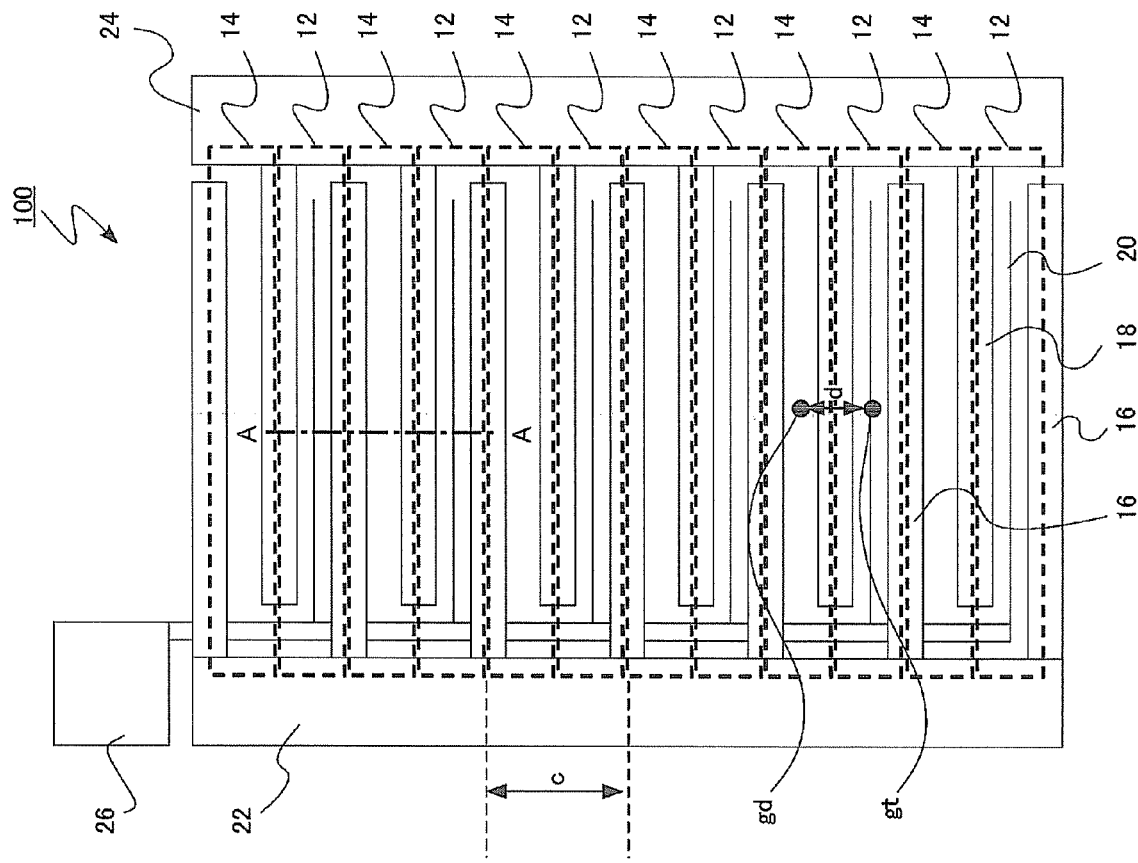
FIG. 1 is a top view of a semiconductor device 100 according to the first embodiment.
Figure 2:
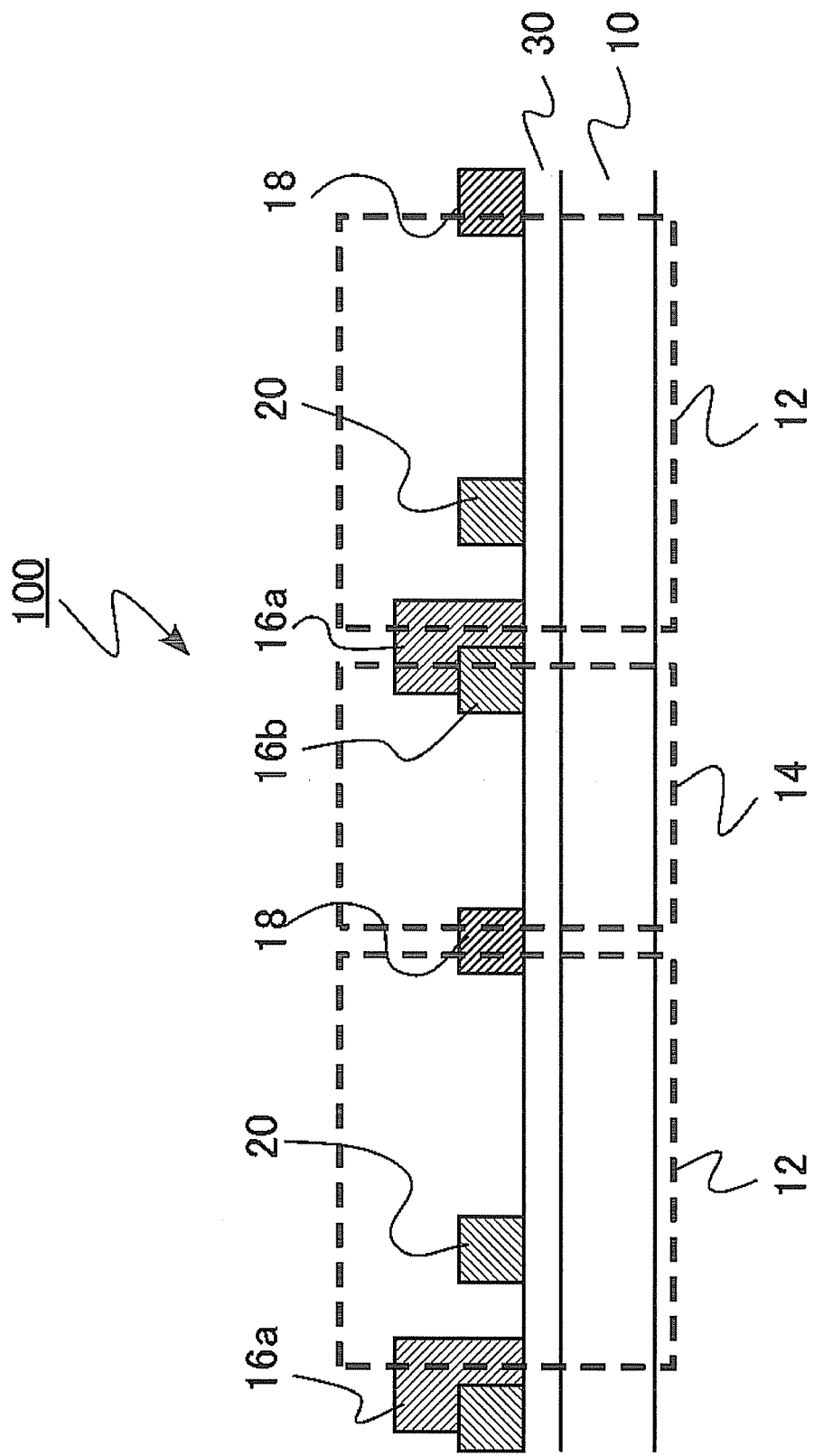
FIG. 2 is a cross sectional view along a line of A-A the FIG. 1.

FIG. 1 is a top view of a semiconductor device 100 according to the first embodiment. FIG. 2 is a cross sectional view along a line of A-A the FIG. 1.

The semiconductor device 100 is for the power conversion which is capable of operating at an operation frequency "f". As shown in FIG. 1, the semiconductor device 100 includes a substrate 10 having the thermal diffusion coefficient "D".

In the first embodiment, the semiconductor device 100 includes plural transistor units 12 and plural diode units 14. Each transistor unit 12 (first element unit) and each diode unit 14 (second element unit) are adjacently formed on the substrate 10. The transistor unit 12 is formed by a transistor. Similarly, the diode unit 14 is formed by a diode.

The transistor of the transistor units 12 and the diode of the diode units 14 act on different timings. Each of the transistor units 12 and each of the diode units 14 are arranged alternately in one direction. A distance "d" of between a gravity center "gt" of the transistor units 12 and a gravity center "gd" of the diode units 14 is equal to or less than twice of a thermal diffusion length $(D/\pi f)^{1/2}$.

Each of the transistor units 12 includes a first electrode 16, a second electrode 18 and a control electrode 20. Each electrode is electrically connected to a first common electrode 22, a second common electrode 24 and a common control electrode 26.

Each of the diode units 14 includes the first electrode 16 and the second electrode 18. Each electrode is electrically connected to the first common electrode 22 and the second common electrode 24.

The transistor units 12 and the diode units 14 are electrically connected in parallel. In FIG. 1, the transistor units 12 and the diode units 14 are arranged alternately in a longitudinal direction with a cycle "c". An interval of between the transistor unit 12 and the diode unit 14 is equal to a half of the cycle "c", which is expressed as "c/2". Or, the interval of between the transistor unit 12 and the diode unit 14 is equal to a distance "d" of between the gravity center "gt" of the transistor units 12 and the gravity center "gd" of the diode units 14. In the semiconductor device 100 of the first embodiment, "c/2" is equal to the distance "d". Therefore, "c/2" is equal to or less than twice of the thermal diffusion length $(D/\pi f)^{1/2}$.

As shown in FIG. 2, the first electrode 16a and the second electrode 18 have a ohmic connection with a semiconductor layer 30 electrically. The first electrode 16b and the control electrode 20 have a Schottky connection with the semiconductor layer 30 electrically.

In FIG. 2, each of the transistor units 12 includes the first electrode 16a, the second electrode 18 and the control electrode 20. Each of the diode unit 14 includes the first electrode 16b and the second electrode 18.

In the transistor unit 12, the first electrode 16a acts as a source electrode. The second electrode 18 acts as a drain electrode. The control electrode 20 acts as a gate electrode. In the diode unit 14, the first electrode 16b acts as an anode electrode. The second electrode 18 acts as a cathode electrode. The first electrode 16a of the transistor unit 12 and the first electrode 16b of the diode unit 14 are electrically connected.

Figure 3:
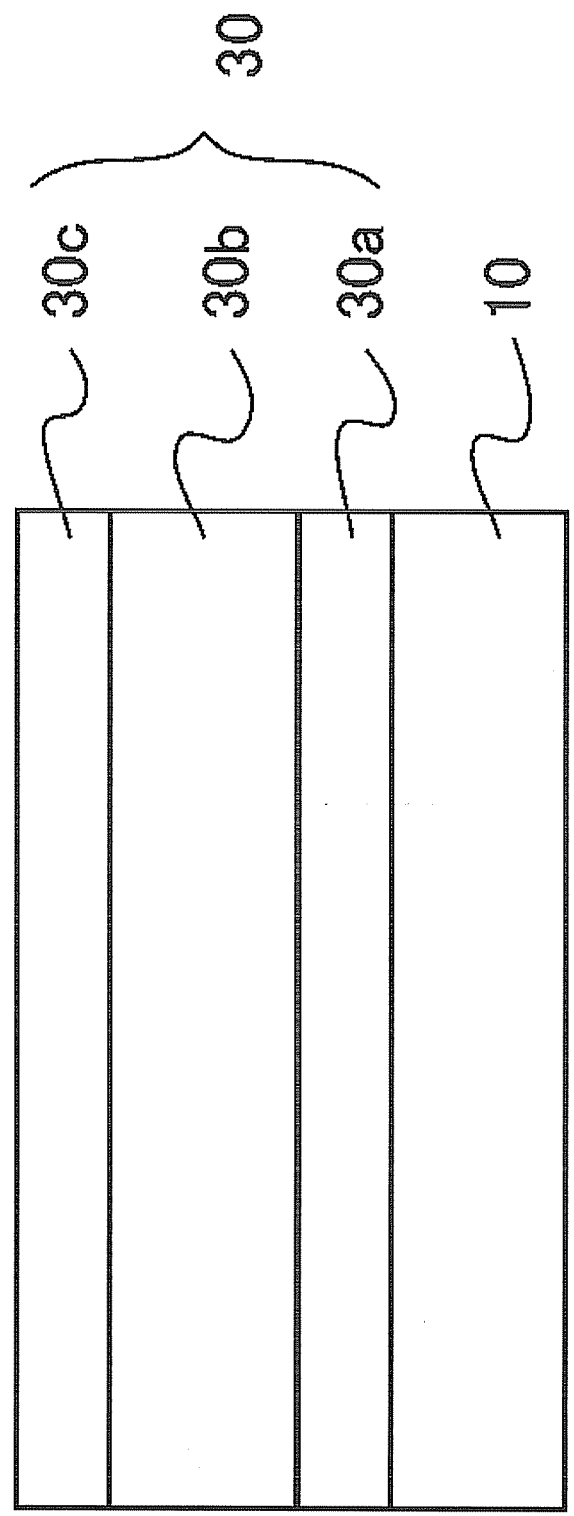
FIG. 3 is a cross sectional view illustrating the substrate and the semiconductor layer.

FIG. 3 is a cross sectional view illustrating the substrate 10 and the semiconductor layer 30. A buffer layer 30a, a gallium nitride (GaN) layer 30b and an aluminum gallium nitride (AlGaN) layer 30c are piled on the substrate 10 made of Silicon (Si).

The electrodes and insulator are formed on the AlGaN layer 30c. Accordingly, the transistor and the diode can be formed as nitride semiconductor elements. Structure of the layers may not be limited to FIG. 3 but at least two kinds of the active elements operating different timings to flow current may be formed on the substrate.

Figure 4:
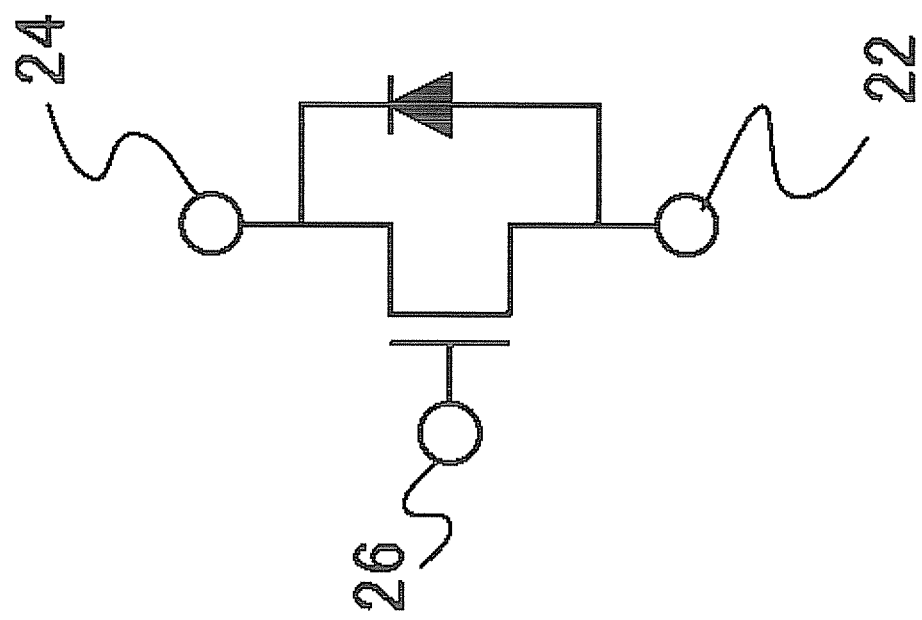
FIG. 4 is a figure explaining an equivalent circuit of the semiconductor device 100.

FIG. 4 is a figure explaining an equivalent circuit of the semiconductor device 100. The diode is connected to the transistor acting as a switching element in parallel.

Figure 5:
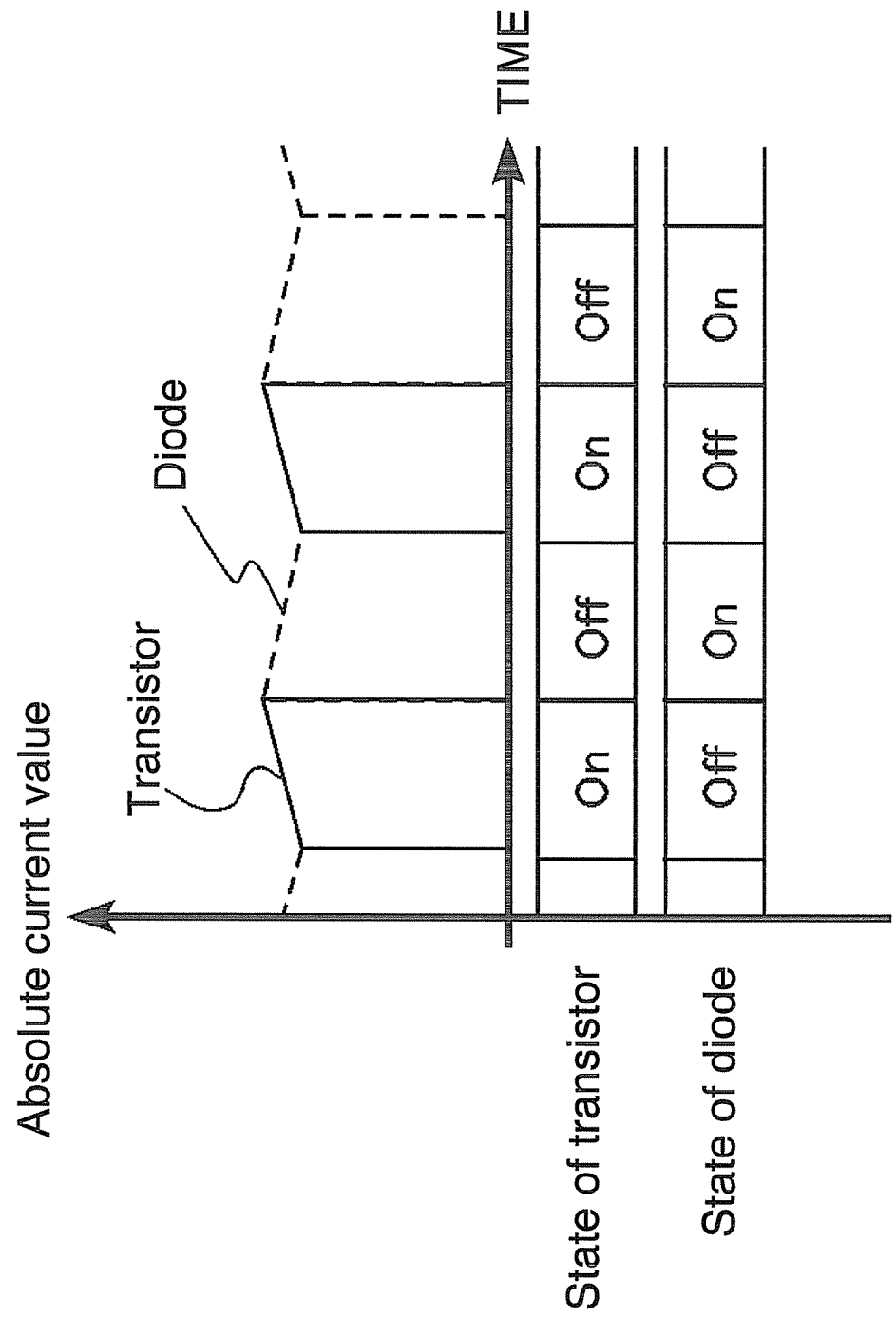
FIG. 5 is a figure showing absolute current value when the equivalent circuit of FIG. 4 operates.

FIG. 5 is a figure showing absolute current value when the equivalent circuit of FIG. 4 operates with being connected to an external resistor (not shown). Moreover, voltage is added to the common control electrode 26, and the transistor is turned on and off repeatedly. Since the electrical currents in the transistor and in the diode have inverse direction for each other, absolute value of the electrical current is shown in FIG. 5.

If the transistor is activated, the electrical current flow in the transistor and does not flow in the diode. On the other hand, if the transistor is inactivated, the electrical current does not flow in the transistor but flows in the diode as a circulating current. Specifically, the diode is inactivated during the transistor is activated. On the other hand, the diode is activated during the transistor is inactivated.

In the semiconductor device 100, the transistor and the diode have different timings to flow current, respectively. The transistor and the diode heat, when the electricity is flowing in the transistor and the diode. As a result, the element temperatures of the transistor and the diode increase. Especially, the wide-gap semiconductor such as the nitride semiconductor has fast operation speed. Accordingly, since a switching loss due to switching active/inactive states is not so large, heating due to the active state mainly contributes to entire loss.

In the semiconductor device 100, heating due to power loss is mainly caused in the transistor and the diode when they are activated. However, the timings of heating are different in the transistor and diode, respectively.

As described above, in the semiconductor device 100, two kinds of the active elements (which are the transistor and the diode) are formed on the substrate 10. The active elements act on different timings. Moreover, the plural transistors and the plural diodes are arranged dispersively. As a result, the semiconductor device 100 can diffuse heats both spatially and temporally.

Figure 6:
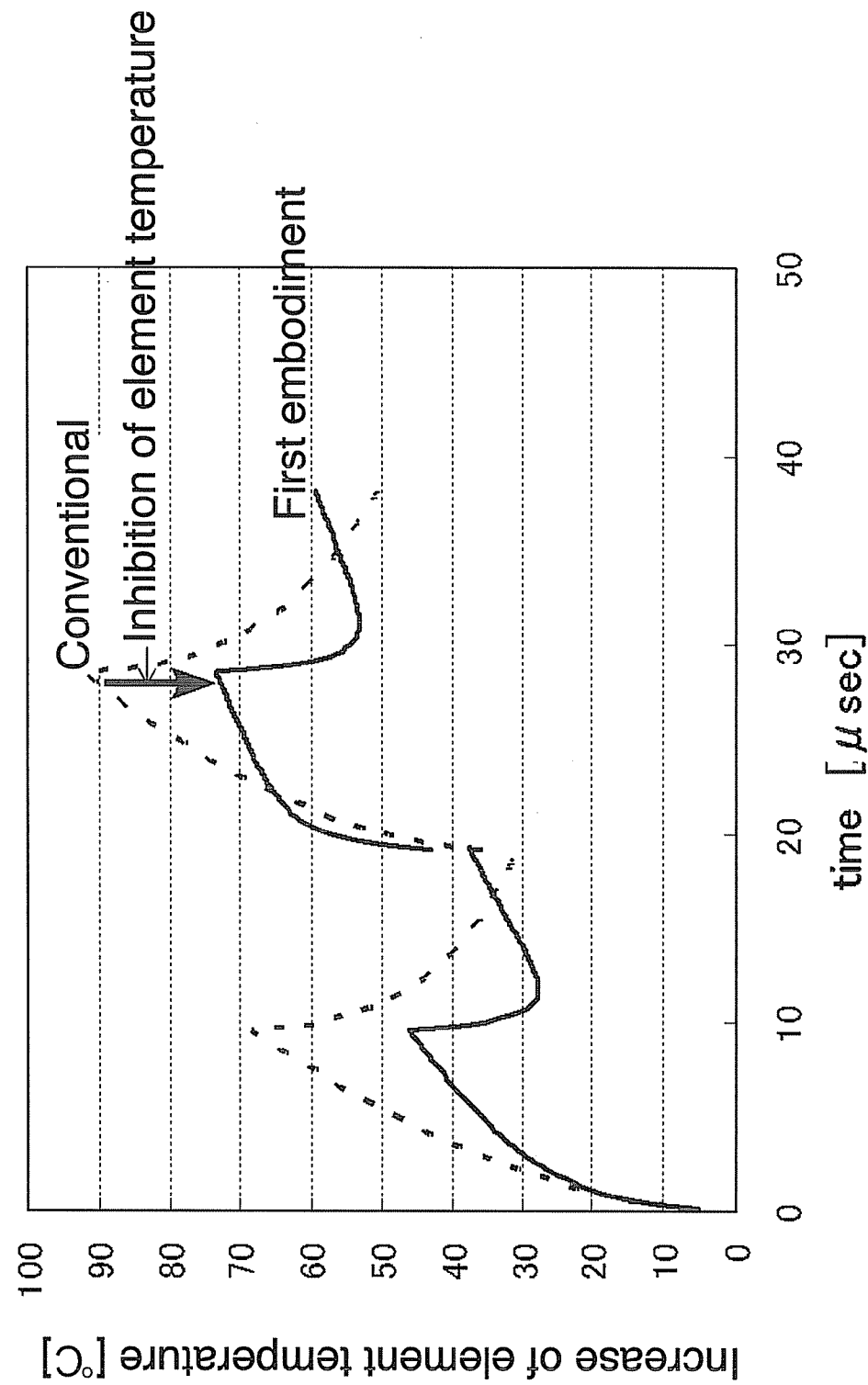
FIG. 6 is a figure showing increase of the element temperatures versus time.

FIG. 6 is a figure showing increase of the element temperatures using the conventional technique and the first embodiment versus time. The element temperature of the transistor is calculated by a computer simulation since the semiconductor device 100 starts to operate.

In the computer simulation, the substrate 10 is made of Silicon (Si) and the operation frequency "f" is 50 [kHz]. The interval of the element units is 15 [µm] and the thickness of the substrate is 100 [µm]. As shown in FIG. 6, the first embodiment can reduce a maximum element temperature by about 20 degree compared with the conventional technique.

Figure 7:
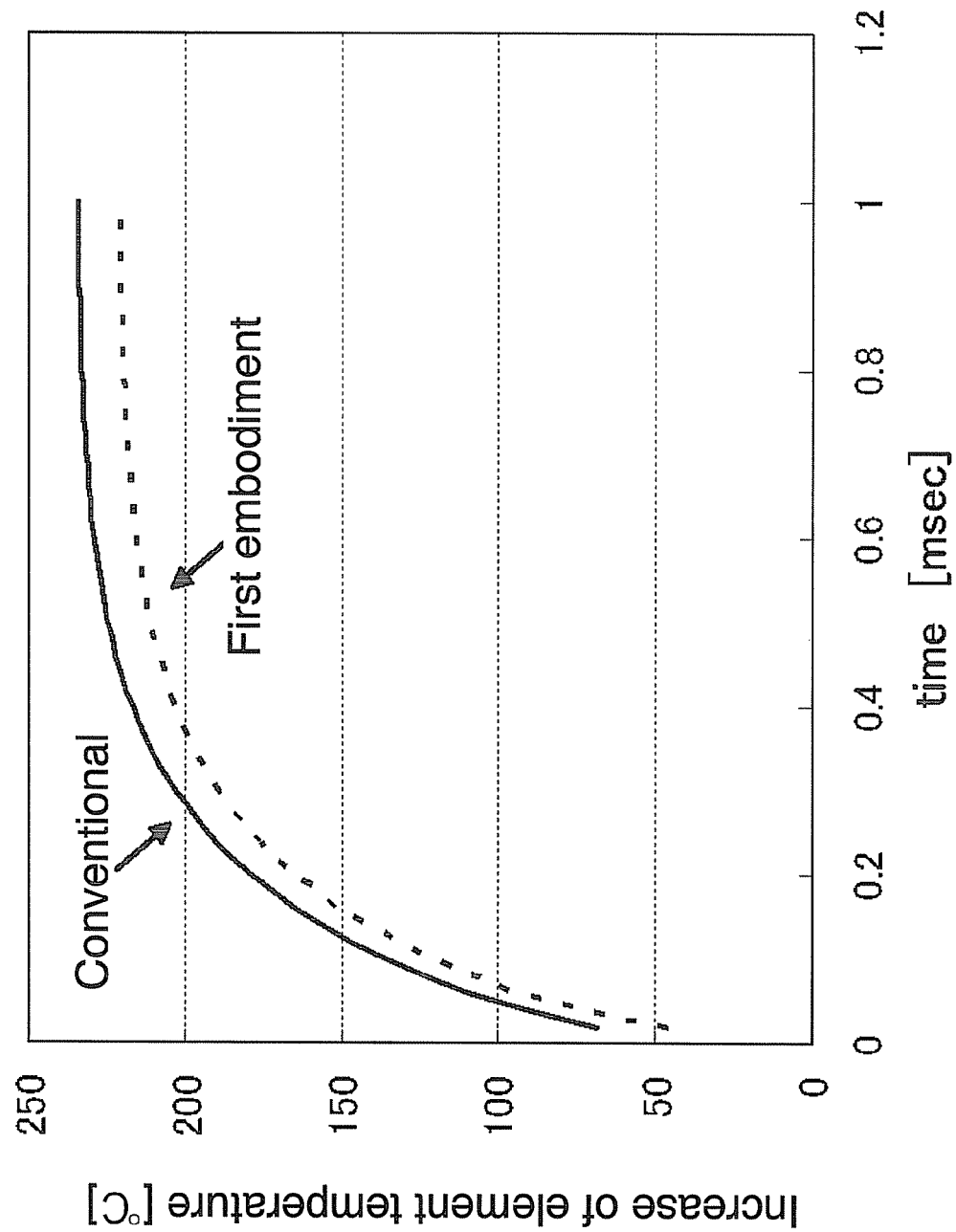
FIG. 7 is a figure showing increase of the element temperatures versus time.

FIG. 7 is a figure showing increase of the element temperatures versus time. Simulation time is longer than that of FIG. 6. As shown in FIG. 7, the element temperature is almost saturated at around 1 [msec].

The element temperature of saturation is 234 [degree] in the conventional technique and 221 [degree] in the first embodiment. It shows that the semiconductor device 100 in the first embodiment inhibits the element temperature of saturation. Accordingly, the semiconductor device 100 reduces degradation of the elements and realizes more reliable elements. Moreover, the semiconductor device 100 does not have the space having no active element. Therefore, the semiconductor device 100 achieves smaller chip area and less cost.

In the first embodiment, the distance "d" of between the gravity center "gt" of the transistor units 12 and the gravity center "gd" of the diode units 14 is equal to or less than twice of a thermal diffusion length $(D/\pi f)^{1/2}$. Or, "c/2" is equal to or less than twice of the thermal diffusion length $(D/\pi f)^{1/2}$, where "c" is the cycle to arrange the transistor unit 12 and the diode units 14 alternately.

The semiconductor device 100 can inhibit increasing the element temperatures by the above structure. Heat equation is expressed by an expression (1) and the heat diffuses according to temperature gradient. A left-hand side of the expression (1) expresses time variation of the element temperature. A right-hand side of the expression (1) is proportional to spatial variation of the temperature gradient. "D" is the thermal diffusion coefficient depending on material of the substrate 10 and expressed by dividing thermal conductivity "k" by density and specific heat capacity. Material with larger thermal conductivity "k" has larger thermal diffusion coefficient "D". Accordingly, heat rapidly diffuses in the material.

$$\frac{\partial T}{\partial t} = D\frac{\partial}{\partial x}\left(\frac{\partial T}{\partial x}\right) \quad (1)$$

Heating due to power loss is repeatedly caused by alternate current operation as shown in FIG. 5. Generally, the heating is uniformed temporally at a position which is further from a heating source by the thermal diffusion length expressed by an expression (2). In the expression (2), "f" is the operation frequency.

$$\sqrt{\frac{D}{\pi f}} \quad (2)$$

The expression (2) means that a smaller operation frequency leads to a longer thermal diffusion length. Moreover, the expression (2) means that the material with larger thermal conductivity "k" also has the longer thermal diffusion length.

Amount of heat is uniformed at the position which is further from the heating source by the thermal diffusion length. If two heating sources exist, the amount of heat is uniformed at a position which is further from both of the two heating sources by the thermal diffusion length. Therefore, heating is temporally diffused when the interval of between the two element units operating at different timings is equal to or less than twice of the thermal diffusion length as described above.

Figure 8:
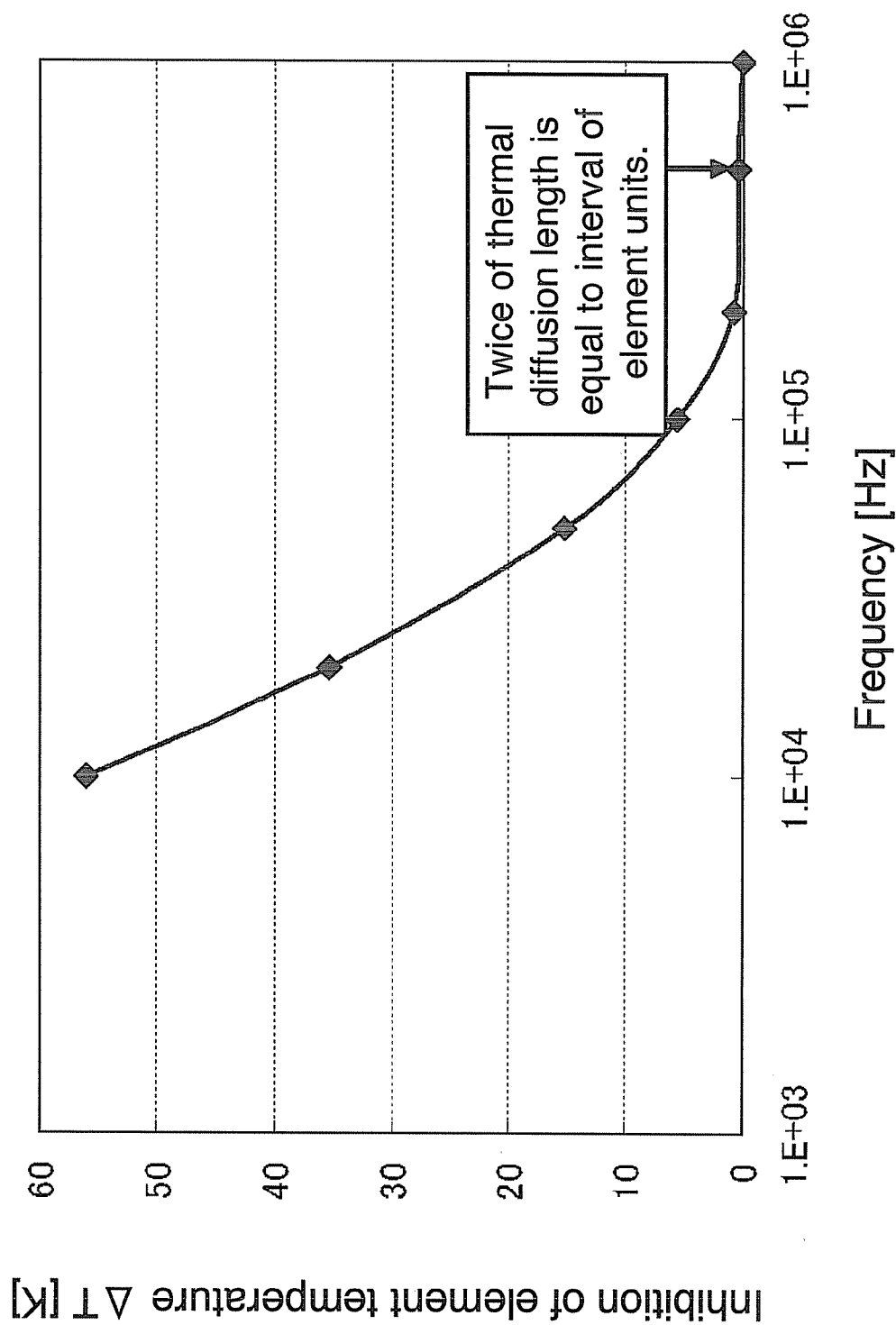
FIG. 8 is a figure showing inhibition of increasing the element temperature with varying the operation frequency.

FIG. 8 is a figure showing inhibition of increasing the element temperature with varying the operation frequency in the semiconductor device 100. A horizontal axis shows the operation frequency and a vertical axis shows a difference between the element temperature using the first embodiment and the element temperature using the conventional technique.

As shown in FIG. 8, as a result of decreasing the operation frequency, the inhibition of increasing the element temperature starts to appear when the twice of the thermal diffusion length is equal to the interval of the element units. The interval of the element units is equal to the distance "d" of between the gravity centers of the element units or the half of the cycle "c/2" of the element units. This simulation result in FIG. 8 shows that the increasing the element temperature can be inhibited by arranging the element units operating at different timings with the interval which is equal to or less than twice of the thermal diffusion length.

Figure 9:
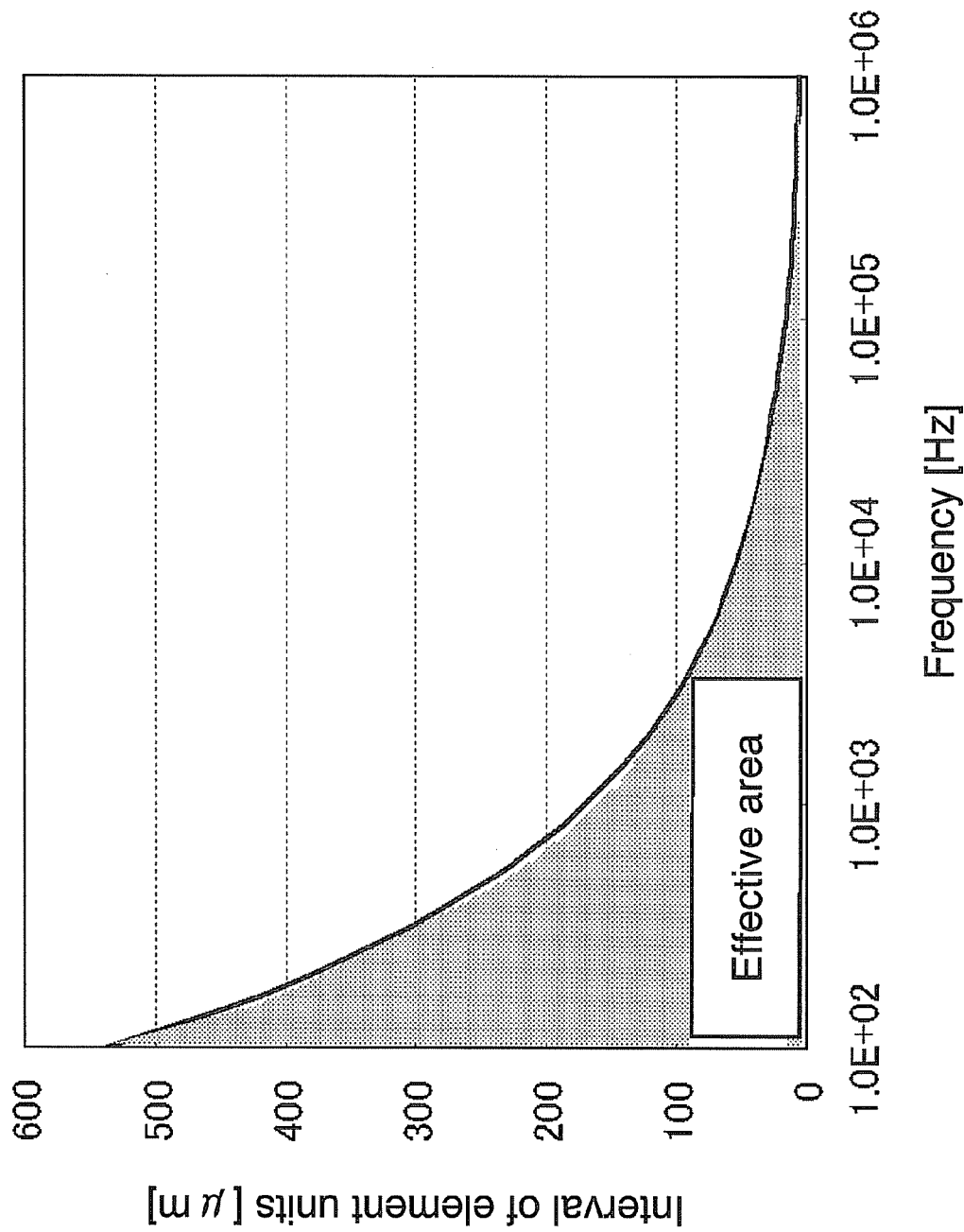
FIG. 9 is a figure showing area which achieves the inhibition of increasing the element temperature.

FIG. 9 is a figure showing area which achieves the inhibition of increasing the element temperature in the semiconductor device 100. The semiconductor device 100 realizes the inhibition of increasing the element temperature if the interval of the element units is equal to or less than twice of the thermal diffusion length of the substrate 10.

Table 1 shows the thermal diffusion lengths' of some materials against some operation frequencies "f". As shown in Table 1, since each material has different the thermal diffusion coefficient due to the expression (2), each material also has different thermal diffusion length. Accordingly, the area which achieves the inhibition of increasing the element temperature is also different depending on the material of the substrate 10. However, Table 1 does not limit the material of the substrate 10.

| Thermal Diffusion Length [µm] | | Operation Frequency "f" | | |
|---|---|---|---|---|
| | | 10 [kHz] | 100 [kHz] | 1 [MHz] |
| Material of substrate 10 | Si | 53.7 | 17.0 | 5.4 |
| | Sic | 69.8 | 22.1 | 7.0 |
| | GaN | 52.2 | 16.5 | 5.2 |
| | Sapphire | 21.2 | 6.7 | 2.1 |

Thickness of the substrate 10 is better to be equal to or smaller than the thermal diffusion lengths. Heat is repeatedly input at the position which is closer from the heating source by the thermal diffusion length. Accordingly, if materials for heat dissipation are set at the position which is closer from the heating source by the thermal diffusion length, heats can be released before the heats are uniformed temporally. To realize the releasing heats, a distance between an inverse side of the substrate 10 being set the heat dissipation and the element units operating at different timings is smaller than the thermal diffusion length. This means that the thickness of the substrate 10 is smaller than the thermal diffusion length.

If the thermal diffusion length is same, an element having larger breakdown voltage can be formed by a material having larger breakdown electric field strength. For example, an element formed by the wide-gap semiconductor is used as the active element. The wide-gap semiconductor may be a nitride semiconductor, a silicon carbide, and a diamond.

The nitride semiconductor and the silicon carbide have the breakdown electric field strength which is about ten times stronger compared with the Silicon and Gallium Arsenide. Accordingly, the element having the breakdown voltage which is about ten times stronger can be formed at a position based on the thermal diffusion length. Also, ten times number of the elements can be formed with a same breakdown voltage. This realizes the semiconductor device for power converting having the high breakdown voltage.

Modified Example of the First Embodiment

Figure 10:
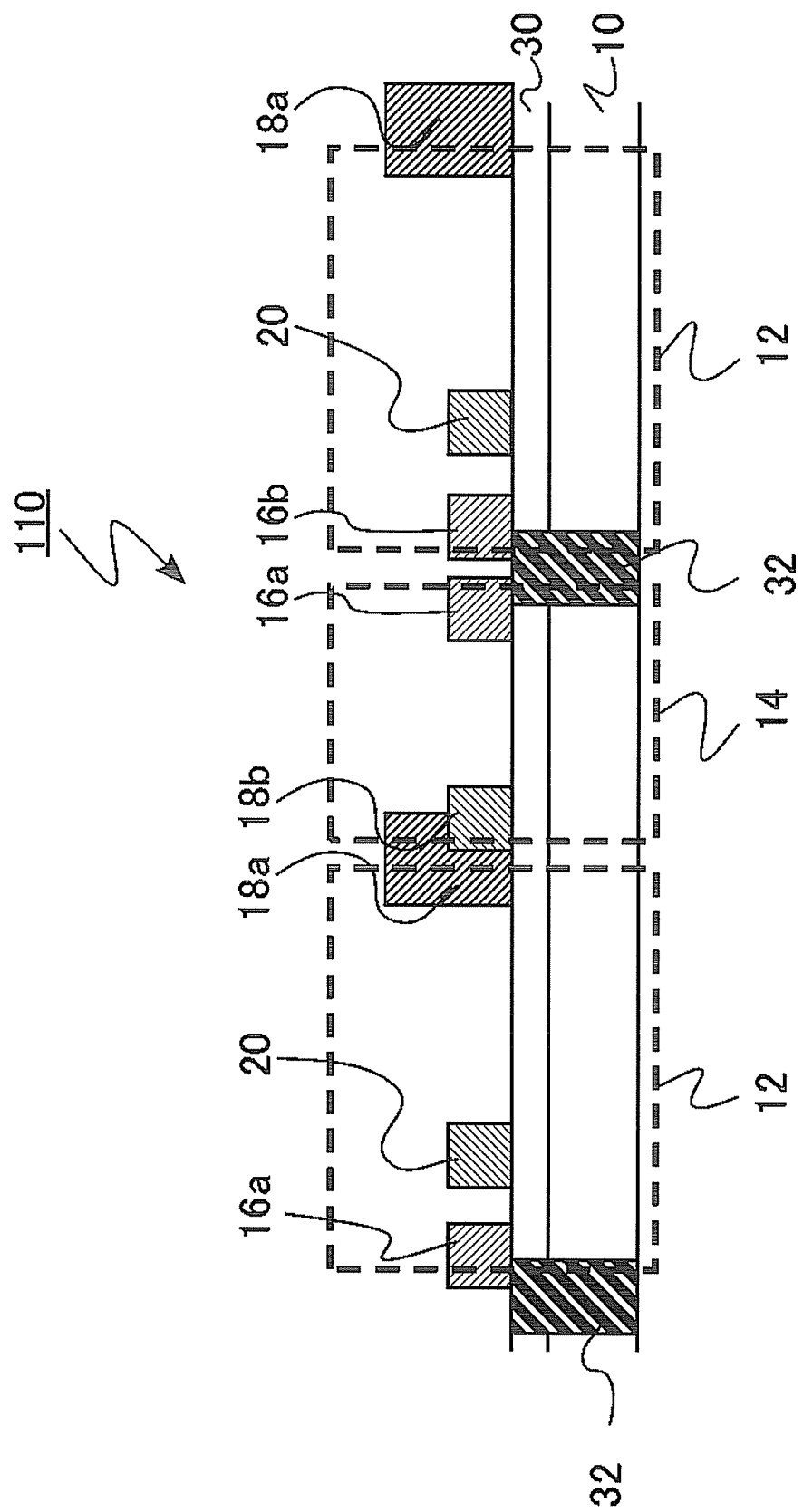
FIG. 10 is a cross sectional view of a semiconductor device 110 according to the modified example of the first embodiment.

FIG. 10 is a cross sectional view of a semiconductor device 110 according to the modified example of the first embodiment. The semiconductor device 110 is different from the semiconductor device 100 about the following points. First, while the first electrodes 16a, 16b are formed with two layers in the semiconductor device 100, they are formed with one layer in the semiconductor device 110. Second, while the second electrode 18 is formed with one layer in the semiconductor device 100, the second electrodes 18a, 18b are formed with two layers in the semiconductor device 110. Third, an area separating elements 32 exists between the transistor unit 12 and the diode unit 14 in the semiconductor device 110. The area separating elements 32 may be formed by ion implantation and trench.

Figure 11:
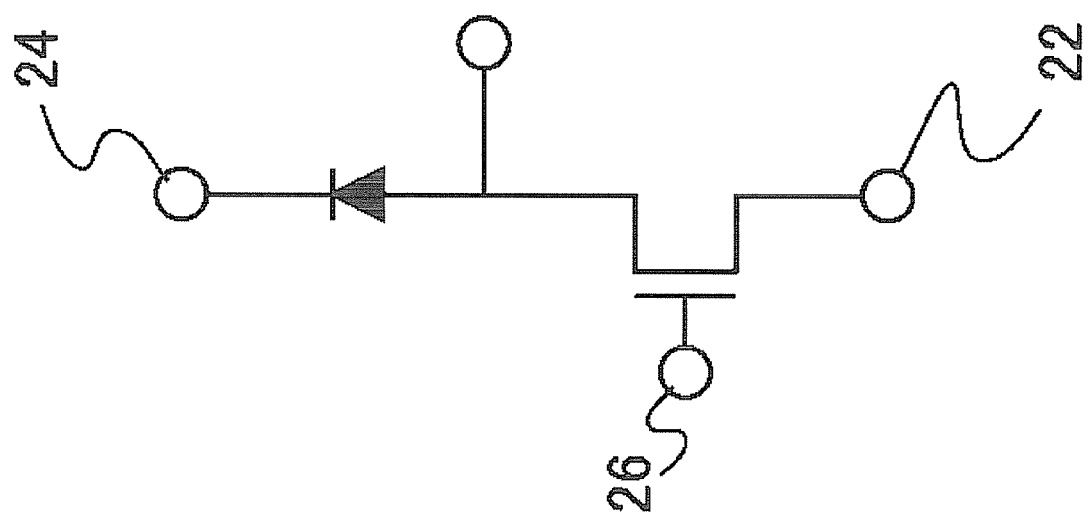
FIG. 11 is a figure explaining an equivalent circuit of the semiconductor device 110.

FIG. 11 is a figure explaining an equivalent circuit of the semiconductor device 110. In the modified example of the first embodiment, the transistor unit 12 and the diode unit 14 operate at different timings. This means that timings of flowing current in the transistor and in the diode are different temporally. Therefore, the semiconductor device 110 inhibits increasing the element temperatures by diffusing heating sources temporally as same as the first embodiment.

As described above, how to wire two kinds of the active elements is not limited but the two kinds of the active elements are formed with an interval on a substrate in order to obtain effects of the first embodiment. Moreover, the area separating elements 32 may be formed between the active elements as mentioned in the modified example of the first embodiment.

The two active elements may not a pair of the transistor and the diode but the two active elements operate at different timings. For example, the two active elements may be any two of the transistor, the diode and IGBT. Moreover, the two active elements may be same elements, for example, two transistors, two diodes or two IGBT. The transistor may be a field-effect transistor or a junction type transistor. The diode may be a Schottky diode or a field-effect diode.

The timings for operating the two active elements are preferably different in order to inhibit increasing the element temperatures as shown in FIG. 5. Even though the timings are not completely different, the semiconductor device may be able to realize effects of the first embodiment.

Description of the Second Embodiment

Figure 12:
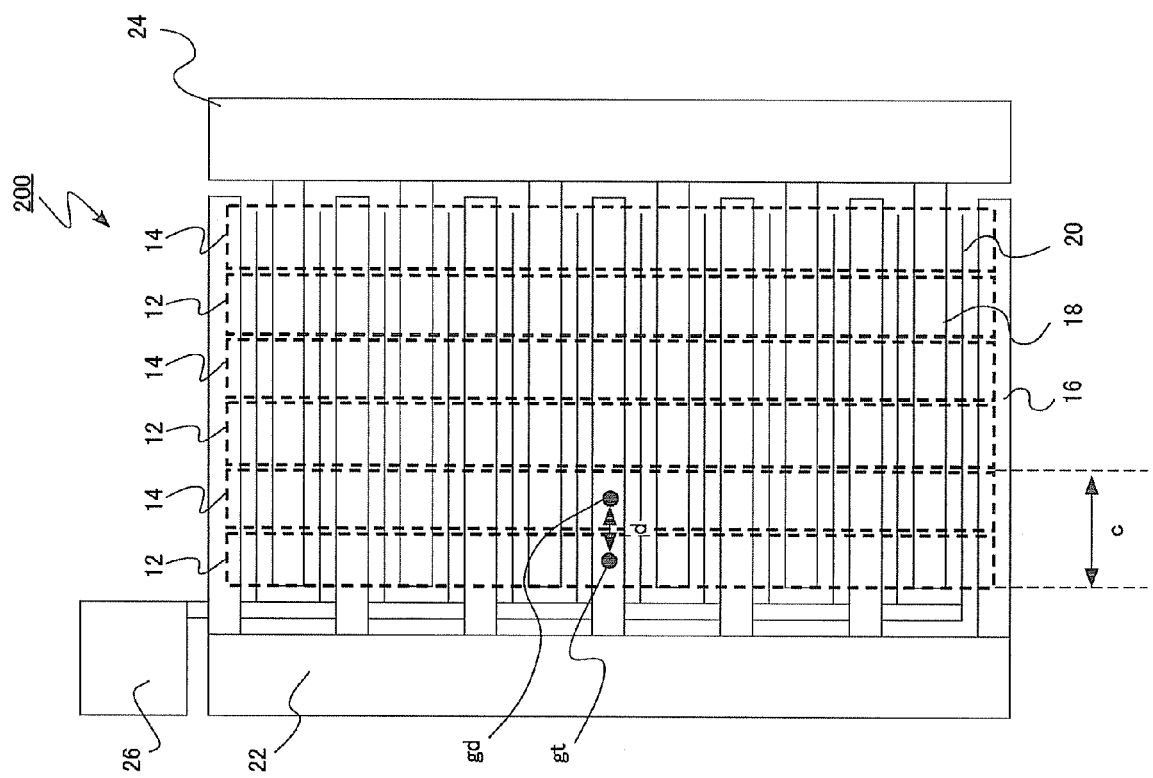
FIG. 12 is a top view of a semiconductor device 200 according to the second embodiment.

FIG. 12 is a top view of a semiconductor device 200 according to the second embodiment. The semiconductor device 200 is for power conversion. As shown in FIG. 12, the semiconductor device 200 includes transistor units 12 and diode units 14. The transistor units 12 and the diode units 14 are alternately arranged in longitudinal direction of FIG. 12.

The transistor unit 12 is formed by transistors. Similarly, the diode unit 14 is formed by diodes. In the semiconductor device 200, the transistors and the diodes are arranged in cross direction of FIG. 12.

In FIG. 12 the transistor units 12 and the diode units 14 are arranged repeatedly with a cycle "c". An interval of between the transistor unit 12 and the diode unit 14 is equal to a half of the cycle "c", which is expressed as "c/2". On the other hand, the distance "d" is a distance between a gravity center "gt" of the transistor units 12 and a gravity center "gd" of the diode units 14. The distance "d" and the half of the cycle "c/2" are equal to or less than twice of the thermal diffusion length $(D/\pi f)^{1/2}$.

Figure 13:
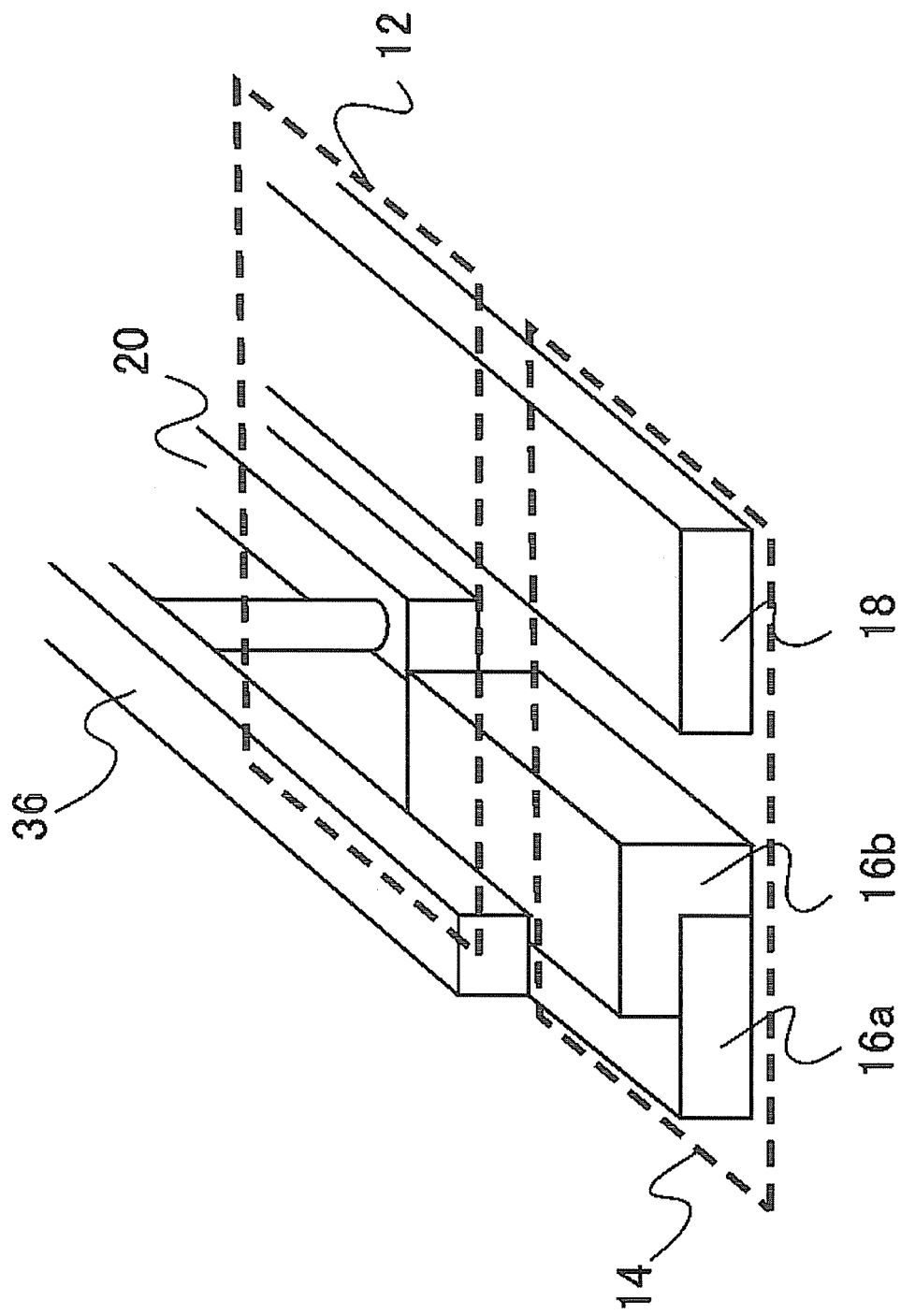
FIG. 13 is a perspective view showing a part of the semiconductor device 200.

FIG. 13 is a perspective view showing a part of the semiconductor device 200. A control electrode (gate electrode) 20 of one of the transistor units 12 is electrically connected to the control electrode 20 of another transistor unit 12 through a line 36. The transistor units 12 are electrically connected in parallel.

A first electrode 16b has the Schottky connection with a semiconductor layer (not shown) electrically. A second electrode 18 has the ohmic connection with the semiconductor layer electrically. The diode unit 14 acts as a Schottky diode by the first electrode 16b and the second electrode 18. The semiconductor device 200 can be expressed by the equivalent circuit shown in the FIG. 4.

As described above, in the semiconductor device 200, two kinds of the active elements (which are the transistor and the diode) are formed on a substrate. The active elements act on different timings. Moreover, the plural transistors and the plural diodes are arranged dispersively. As a result, the semiconductor device 200 can diffuse heats both spatially and temporally.

Moreover, in the semiconductor device 200, the interval of the element units is equal to or less than twice of the thermal diffusion length. Therefore, the semiconductor device 200 realizes inhibition of increasing the element temperatures as same as the semiconductor device 100 of the first embodiment.

Modified Example of the Second Embodiment

Figure 14:
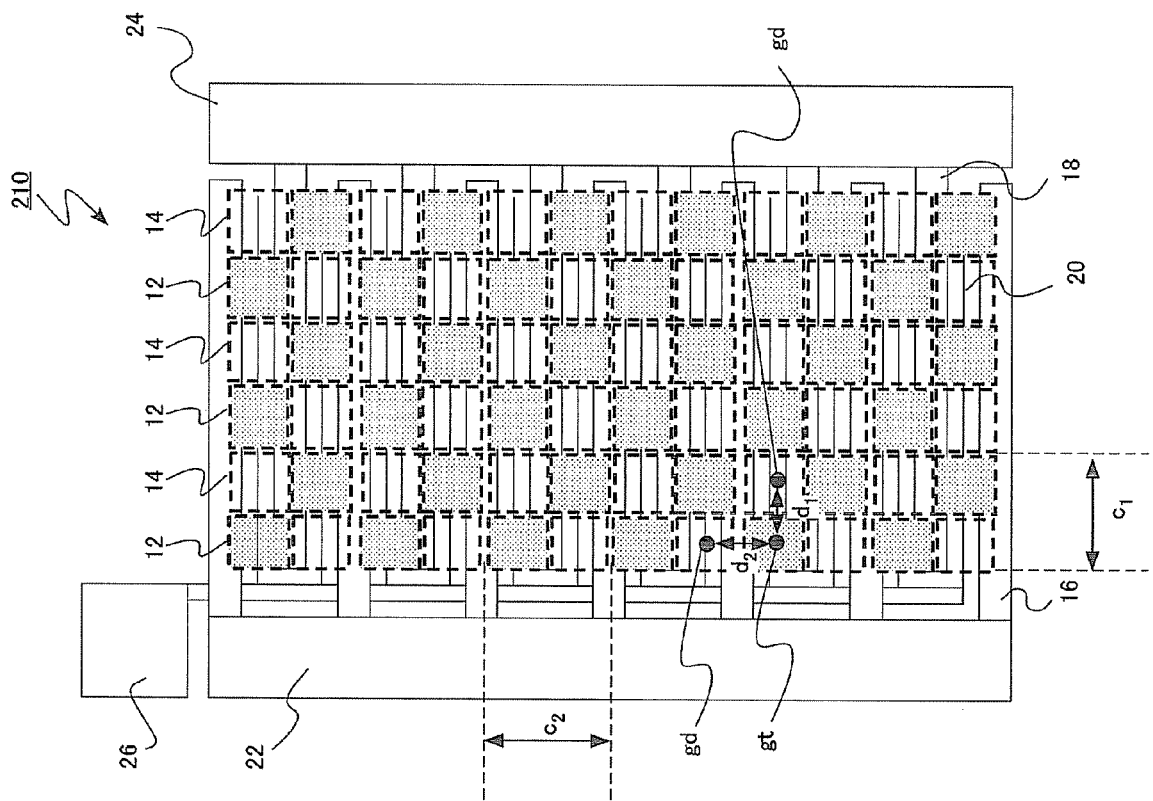
FIG. 14 is a top view of a semiconductor device 210 according to the modified example of the second embodiment.

FIG. 14 is a top view of a semiconductor device 210 according to the modified example of the second embodiment. The transistors and the diodes are arranged like a grid in the semiconductor device 210. Specifically, the transistors and the diodes are alternately arranged in both cross and longitudinal directions. Since the heating sources are more diffused, the element temperatures are more inhibited.

The transistor units 12 and the diode units 14 are repeatedly arranged with a cycle "c1" in the cross direction and a cycle "c2" in the longitudinal direction. As shown in FIG. 14, a distance between a gravity center "gt" of the transistor units 12 and a gravity center "gd" of the diode units 14 is expressed as a distance "d1" in the cross direction and a distance "d2" in the longitudinal direction.

A half of the cycle "c1/2", a half of the cycle "c2/2", the distance "d1" and the distance "d2" are equal to or less than twice of the thermal diffusion length.

As described above, the semiconductor device 210 inhibits increasing the element temperatures by arranging the two kinds of the active elements dispersively and defines an interval between the element units formed by the active elements. The element units may be arranged diagonally, in a grid, or in a hexagonal grid. Moreover, how to wire the element units is not limited.

The element units arranging periodically as described in the first and second embodiments are useful to design easily and diffuse heats. However, the element units may not be arranged periodically but the distance between the gravity centers of the element units is equal to or less than twice of the thermal diffusion length in order to inhibit increasing the element temperatures.

Description of the Third Embodiment

Figure 15:
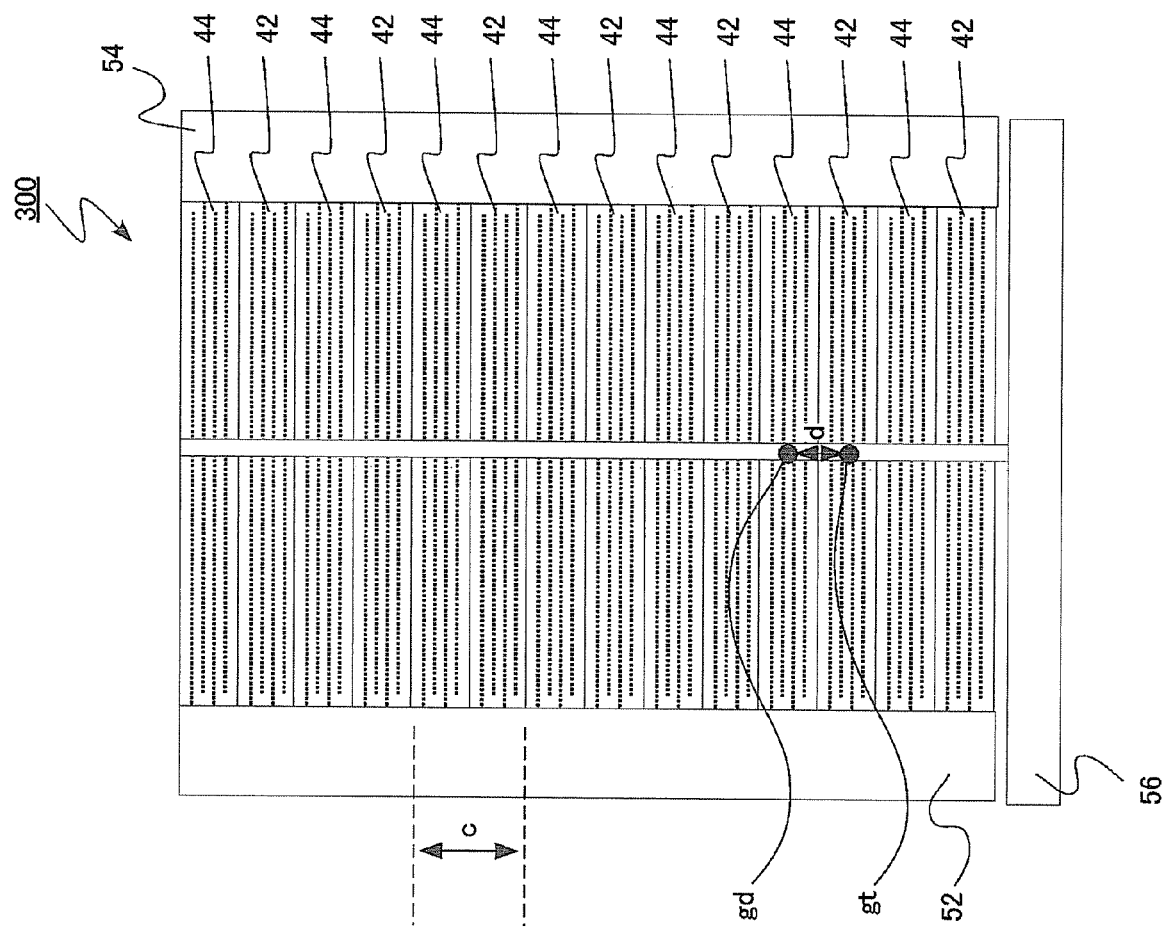
FIG. 15 is a top view of a semiconductor device 300 according to the third embodiment.

FIG. 15 is a top view of a semiconductor device 300 according to the third embodiment. The semiconductor device 300 is for power conversion.

The semiconductor device 300 includes a transistor units 42 and a diode units 44. The transistor units 42 and the diode units 44 are alternately arranged in the longitudinal direction. The transistor unit 42 is formed by transistors. Similarly, the diode unit 44 is formed by diodes. The semiconductor device 300 further includes a first common electrode 52, a second common electrode 54 and a common control electrode 56.

A distance "d" of between a gravity center "gt" of the transistor units 42 and a gravity center "gd" of the diode units 44 is equal to the interval of the element units. The transistor units 42 and the diode units 44 are arranged repeatedly with a cycle "c". The distance "d" and the half of the cycle "c/2" are equal to or less than twice of the thermal diffusion length.

While each element unit includes one active element in the semiconductor device 100 of the first embodiment, each element unit includes plural active elements in the semiconductor device 300 of the third embodiment.

As described in the first embodiment, if the interval of the element units which respectively heat on different timings is equal to or less than twice of a thermal diffusion length, the semiconductor device 300 can diffuse heats both spatially and temporally. Therefore, the semiconductor device 300 realizes inhibition of increasing the element temperatures.

The element units may be arranged diagonally, in a grid, or in a hexagonal grid. Also, how to wire the element units is not limited. Moreover, the element units may not be arranged periodically but the distance between the gravity centers of the element units is equal to or less than twice of the thermal diffusion length in order to inhibit increasing the element temperatures.

If the thermal diffusion length is same, an element having larger breakdown voltage can be formed by a material having larger breakdown electric field strength. For example, an element formed by the wide-gap semiconductor is used as the active element. The wide-gap semiconductor may be a nitride semiconductor and a silicon carbide.

The nitride semiconductor and the silicon carbide have the breakdown electric field strength which is about ten times stronger compared with the Silicon and Gallium Arsenide. Accordingly, the element having the breakdown voltage which is about ten times stronger can be formed at a position based on the thermal diffusion length. Also, ten times number of the elements can be formed with a same breakdown voltage. This realizes a semiconductor device for power converting having the high breakdown voltage.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions.

The accompanying claims and their equivalents are intended to cover such forms or modifications as would fall within the scope and spirit of the inventions.

What is claimed is:

1. A wide-gap semiconductor device, the device comprising:
a substrate having a thermal diffusion coefficient "D";
a plurality of first element units formed on the substrate, the first element units each including a first active element; and
a plurality of second element units, the second element units each including a second active element, the second active element acting on a different timing from the first active element each of the first element units and each of the second element units being arranged alternately, wherein
a distance of between a first gravity center of the first element unit and a second gravity center of the second element unit is equal to or less than twice of a thermal diffusion length $(D/(\pi f))^{1/2}$, excluding zero, so that the first element units and the second element units are spatially separated from each other, and wherein
any two of the first element units do not share a first electrode or a second electrode with each other, and wherein
any two of the second element units do not share the first electrode or the second electrode with each other, and wherein
the first electrode and the second electrode are included in each of the first element units and each of the second element units, and wherein
the thermal diffusion length being within a range when the semiconductor operates at a frequency "f", and the frequency "f" being between 10 kHz and 1 MHz, and wherein
the first active element units are transistors and the second active elements are diodes.

2. The device of claim 1, wherein a thickness of the substrate is equal to or smaller than the thermal diffusion length.

3. The device of claim 1, wherein the second active element is inactivated while the first active element is activated.

4. The device of claim 1, wherein the first active element and the second active element are wide-gap semiconductors.

5. The device of claim 4, wherein the wide-gap semiconductor is a nitride semiconductor or a silicon carbide.

6. A wide-gap semiconductor device, the device comprising:
a substrate having a thermal diffusion coefficient "D";
a plurality of first element units formed on the substrate, the first element units each including a first active element; and
a plurality of second element units, the second element units each including a second active element, the second active element acting on a different timing from the first active element, each of the first element units and each of the second element units being arranged alternately wherein
each of the first element units and the second element units are repeatedly arranged with a cycle, a half of the cycle being equal to or less than twice of a thermal diffusion length $(D/(\pi f))^{1/2}$, the cycle excluding zero, so that the first element units and the second element units are spatially separated from each other, and wherein any two of the first element units do not share a first electrode or a second electrode with each other, any two of the second element units do not share the first electrode or the second electrode with each other, and wherein the first electrode and the second electrode are included in each of the first element units and each of the second element units, and wherein the thermal diffusion length being within a range when the semiconductor operates at a frequency "f", and the frequency "f" being between 10 kHz and 1 MHz, and wherein the first active element units are transistors and the second active elements are diodes.

7. The device of claim 6, wherein a thickness of the substrate is equal to or smaller than the thermal diffusion length.

8. The device of claim 6, wherein the second active element is inactivated while the first active element is activated.

9. The device of claim 6, wherein the first active element and the second active element are wide-gap semiconductors.

10. The device of claim 9, wherein the wide-gap semiconductor is a nitride semiconductor or a silicon carbide.

* * * * *